United States Patent
Kajiwara et al.

(10) Patent No.: US 8,453,315 B2
(45) Date of Patent: Jun. 4, 2013

(54) METHOD OF PRODUCING A PERPENDICULAR MAGNETIC DISC

(75) Inventors: Takenori Kajiwara, Singapore (SG); Tokichiro Sato, Singapore (SG)

(73) Assignee: WD Media (Singapore) Pte, Ltd., Singapore (SG)

( * ) Notice: Subject to any disclaimer, the term of this patent is extended or adjusted under 35 U.S.C. 154(b) by 37 days.

(21) Appl. No.: 13/071,187

(22) Filed: Mar. 24, 2011

(65) Prior Publication Data
US 2012/0066896 A1  Mar. 22, 2012

(30) Foreign Application Priority Data
Mar. 31, 2010 (JP) ................ 2010-082385

(51) Int. Cl.
*G11B 5/127* (2006.01)
*H04R 31/00* (2006.01)

(52) U.S. Cl.
USPC .......... 29/603.03; 29/603.04; 29/603.06; 29/603.07; 360/110; 360/98.01

(58) Field of Classification Search
USPC .......... 29/603.03, 603.07, 603.09, 603.16, 29/606, 417; 360/77.11, 97.02, 97.04, 132, 360/133, 135; 428/800, 833, 836.3, 846.5
See application file for complete search history.

(56) References Cited

U.S. PATENT DOCUMENTS

| | | | |
|---|---|---|---|
| 6,841,224 B2 * | 1/2005 | Kamata et al. | 428/836.3 |
| 2008/0292909 A1 * | 11/2008 | Igarashi et al. | 428/846.5 |
| 2009/0191331 A1 * | 7/2009 | Umezawa et al. | 427/130 |
| 2010/0246060 A1 * | 9/2010 | Sasaki | 360/110 |
| 2010/0255348 A1 * | 10/2010 | Sato et al. | 428/800 |

FOREIGN PATENT DOCUMENTS
JP  2006-309922  11/2006

* cited by examiner

*Primary Examiner* — Paul D Kim

(57) ABSTRACT

A method for manufacturing a perpendicular magnetic disk 100 that includes a step of forming, on a base 110, a granular magnetic layer 160 in which a grain boundary portion is formed by segregation of a non-magnetic substance containing an oxide as a main component around magnetic particles containing a CoCrPt alloy grown in a columnar shape as a main component. The method also includes a step of forming an auxiliary recording layer 180 that contains a CoCrPtRu alloy as a main component and has a film thickness of 1.5 to 4 nm above the granular magnetic layer, and a step of heating the base formed with the auxiliary recording layer in a temperature range of 210 to 250° C.

3 Claims, 4 Drawing Sheets

| | FILM THICKNESS [nm] | Cr CONTENT [at%] | Ru CONTENT [at%] | MS [emu/cm3] | SNR [dB] |
|---|---|---|---|---|---|
| EXAMPLE1 | 2.5 | 2 | 8 | 795 | 16.2 |
| EXAMPLE2 | 2.5 | 4 | 8 | 720 | 16.9 |
| EXAMPLE3 | 2.5 | 5 | 8 | 673 | 17.0 |
| EXAMPLE4 | 2.5 | 8 | 8 | 586 | 16.5 |
| EXAMPLE5 | 2.5 | 10 | 8 | 485 | 16.0 |
| EXAMPLE6 | 2.5 | 5 | 2 | 782 | 16.1 |
| EXAMPLE7 | 2.5 | 5 | 3 | 765 | 16.5 |
| EXAMPLE8 | 2.5 | 5 | 5 | 725 | 16.8 |
| EXAMPLE9 | 2.5 | 5 | 8 | 673 | 17.0 |
| EXAMPLE10 | 2.5 | 5 | 10 | 630 | 16.8 |
| EXAMPLE11 | 2.5 | 5 | 12 | 592 | 16.2 |

METHOD OF PRODUCING A PERPENDICULAR MAGNETIC DISC

TECHNICAL FIELD

The present invention relates to a method for manufacturing a perpendicular magnetic disk to be mounted on an HDD (hard disk drive) or the like of a perpendicular magnetic recording type.

BACKGROUND ART

With an increase in capacity of information processing in recent years, various information recording technologies have been developed. In particular, the surface recording density of an HDD using a magnetic recording technology is continuously increasing at an annual rate of approximately 50%. In recent years, an information recording capacity exceeding 320 gigabytes per platter has been demanded in a perpendicular magnetic recording medium with a 2.5 inch diameter for use in an HDD or the like. To fulfill such a demand, an information recording density exceeding 500 GBit/square inch is desired to be achieved.

Important factors for achieving a high recording density in a perpendicular magnetic disk include securement of electromagnetic conversion characteristics such as improvement in TPI (Tracks per Inch) achieved by narrowing a track width, an SNR (Signal to Noise Ratio) at an improvement time of BPI (Bits per Inch), or an overwrite characteristic (OW characteristic) indicating ease of signal writing, further, securement of resistance to thermal fluctuation in such a state that a recording bit has become small due to the above-described matter, and the like. Of them, improvement in SNR under a high recording density condition is important.

Since a granular magnetic layer forms fine particles due to separation of an oxide phase and a metal phase from each other, it is effective for achieving a high SNR. Though particles in the granular magnetic layer must be made fine for achieving a high recording density, magnetic energy of particles also becomes small due to the fineness, which results in a problem of the thermal fluctuation. On the other hand, in order to avoid the problem of the thermal fluctuation, it is necessary to enhance magnetic anisotropy in a medium, but since a coercive force also becomes higher according to enhancement of the magnetic anisotropy, writing becomes difficult. That is, there is a demand for enhancement of both of the overwrite characteristic and the resistance to thermal fluctuation.

In Patent Document 1, an auxiliary layer for writing (corresponding to an auxiliary recording layer) formed so as to be brought into contact with a main recording layer above or below the main recording layer has been proposed. In Patent Document 1, the main recording layer is a magnetic layer having a granular structure and the auxiliary layer for writing is composed of CoCr alloy (for example, CoCrPtB). In Patent Document 1, there is a description that both of the overwrite characteristic and the resistance to thermal fluctuation can be achieved by providing the auxiliary layer for writing.

PRIOR ART DOCUMENT

Japanese Unexamined Patent Application Publication No. 2006-309922

DISCLOSURE OF INVENTION

Problems to be Solved by the Invention

However, the auxiliary recording layer improves the overwrite characteristic and the resistance to thermal fluctuation, but since it has a magnetic continuity in an in-plane direction, it also constitutes a noise source, where side fringing also becomes large easily. Therefore, the thicker, the film thickness of the auxiliary recording layer, the larger the noise becomes, which results in factor for blocking a high recording density. Further, when the film thickness of the auxiliary recording layer is thick, magnetic spacing between a magnetic head and a soft magnetic layer increases, conversely, a layer which should assist writing acts so as to block writing due to the film thickness thereof itself. Therefore, there is a demand for thinning the auxiliary recording layer in order to achieve reduction in noise and improvement in overwrite characteristic.

In order to thin the auxiliary recording layer without damaging a magnetic function thereof, it is thought to increase a saturation magnetization Ms of a material. This is because strength of the magnetic layer which is a thin film is determined according to a product of a saturation magnetization and a film thickness (Ms·t), where t indicates the film thickness of the magnetic layer.

However, there is such a problem that, when the auxiliary recording layer is thinned by enhancing Ms simply, the SNR is considerably lowered. Therefore, it is conventionally forced to set the MS of the auxiliary recording layer to be relatively low while setting the film thickness to be relatively thick.

In view of these circumstances, an object of the present invention is to thin the auxiliary recording layer while maintaining a function as the auxiliary recording layer, thereby achieving improvement in SNR.

Means for Solving the Problems

In order to solve the problem, the inventors have conducted careful examination, and have found that, since the auxiliary recording layer is inherently continuing magnetically in an in-plane direction, c-axis of an hcp crystal structure of Co must be oriented in a perpendicular direction to the auxiliary recording layer. On the other hand, a grain boundary containing an oxide as a main component is formed around magnetic crystal particles in the granular magnetic layer. Therefore, the inventors have considered that, if an auxiliary recording layer is formed on the granular magnetic layer, disturbance occurs in crystals in an initial growth stage of the auxiliary recording layer on the grain boundary, which results in lowering of crystallinity. It is also considered that, when a portion where crystallinity has lowered is present in the auxiliary recording layer, an increase amount of noise becomes larger in a material having a higher Ms, so that the SNR conventionally lowers according enhancement of the MS. Since increase of the film thickness generally tends to improve the crystallinity, it is thought that the reason why the film thickness must conventionally be made thick is because disturbance in crystals in the initial growth stage is compensated.

In view of these circumstances, as the result of further examination, lowering of the SNR can be suppressed by adding Ru in the auxiliary recording layer, so that the auxiliary recording layer can be made thin. It is thought that this is because the crystallinity in the initial growth stage of the auxiliary recording layer has been improved by Ru. Furthermore, as the result of examination of various conditions for improving the SNR, the inventors have found that further improvement in SNR can be achieved by performing heating after formation of the auxiliary recording layer at a temperature in a predetermined temperature range and have completed the present invention.

That is, in order to solve the above problem, a representative configuration of a method for manufacturing a perpendicular magnetic disk according to the present invention comprises: a granular magnetic layer forming step of forming, on a base, a granular magnetic layer in which a grain boundary portion is formed by segregation of a non-magnetic substance containing an oxide as a main component around magnetic particles containing a CoCrPt alloy grown in a columnar shape as a main component; an auxiliary recording layer forming step of forming an auxiliary recording layer that contains a CoCrPtRu alloy as a main component and has a film thickness of 1.5 to 4 nm above the granular magnetic layer; and a heating step of heating the base formed with the auxiliary recording layer in a temperature range of 210 to 250° C. Incidentally, the term "main component" in this specification (text) indicates the most component contained in a material when entire compositions of the material are represented by at % (or mol %).

According to the above configuration, since the crystallinity of the auxiliary recording layer can be improved by preparing the auxiliary recording layer containing a CoCrPtRu alloy as a main component, thinning can be achieved while performance required for the auxiliary recording layer is maintained. Thereby, reduction of noise occurring from the auxiliary recording layer can be achieved. After the auxiliary recording layer is formed, the SNR can be suitably improved by heating the base in the above-mentioned temperature range. It is thought that this is because effect of heat at the heating step is well transferred to the auxiliary recording layer by the thinning, so that discharge of Cr into the grain boundary can be performed properly. Furthermore, as an additional effect, the overwrite characteristic can be improved by reduction of a magnetic spacing between a magnetic head and a soft magnetic layer.

Note that, when the film thickness of the auxiliary recording layer is thicker than 4 nm, even if the heating temperature is raised to the abovementioned temperature range, such an effect that the SNR is improved cannot be obtained. On the other hand, when the film thickness of the auxiliary recording layer is less than 1.5 nm, the inherent function of the auxiliary recording layer that assists writing can be exhibited. Further, when the heating is performed at a temperature less than 210° C., the effect of SNR improvement cannot be obtained. On the other hand, when the heating temperature exceeds 250° C., the structures of the granular magnetic layer and the auxiliary recording layer are disturbed by diffusion due to excessive heat. That is, elements in the granular magnetic layer and the auxiliary recording layer diffuse so that a granular structure may be destroyed due to binding of granules or the like.

It is preferred that the content of Cr that is a main component in the auxiliary recording layer is in a range of 4 at % to 8 at %. When the content of Cr exceeds 8 at %, there is a possibility that the saturation magnetization Ms of the auxiliary recording layer excessively lowers so that the inherent function of the auxiliary recording layer is not exhibited. On the other hand, when the content of Cr is less than 4 at %, there is a possibility that the saturation magnetization Ms becomes excessively high, so that the auxiliary recording layer constitutes a noise source. Therefore, it is preferred that the content of Cr falls within the above-mentioned range.

It is preferred that the content of Ru that is the main component in the above-mentioned auxiliary recording layer is in a range of 3 at % to 10 at %. When the content of Ru is less than 3 at %, the effect of crystallinity improvement cannot be obtained sufficiently. On the other hand, when the content of Ru exceeds 10 at %, the amount of Co is deficient in the auxiliary recording layer, so that the saturation magnetization Ms becomes excessively low. Accordingly, it is preferred that the content of Ru falls within the abovementioned range.

Effect of the Invention

According to the present invention, since the crystallinity of the auxiliary recording layer can be improved by preparing the auxiliary recording layer containing a CoCrPtRu alloy as a main component and performing heating at a predetermined temperature, thinning can be achieved while the performance required for the auxiliary recording layer is maintained, so that improvement in SNR can be achieved.

BEST MODE FOR CARRYING OUT THE INVENTION

Preferred embodiments of the present invention will be described in detail below with reference to the attached drawings. The dimensions, materials, and others such as specific numerical values shown in the embodiments are merely examples so as to facilitate understanding of the invention, and are not meant to restrict the present invention unless otherwise specified. Note that in the specification and the drawings, components having substantially the same functions and structures are provided with the same reference numerals and are not redundantly described, and components not directly relating to the present invention are not shown in the drawings.

Perpendicular Magnetic Disk

Figure 1:
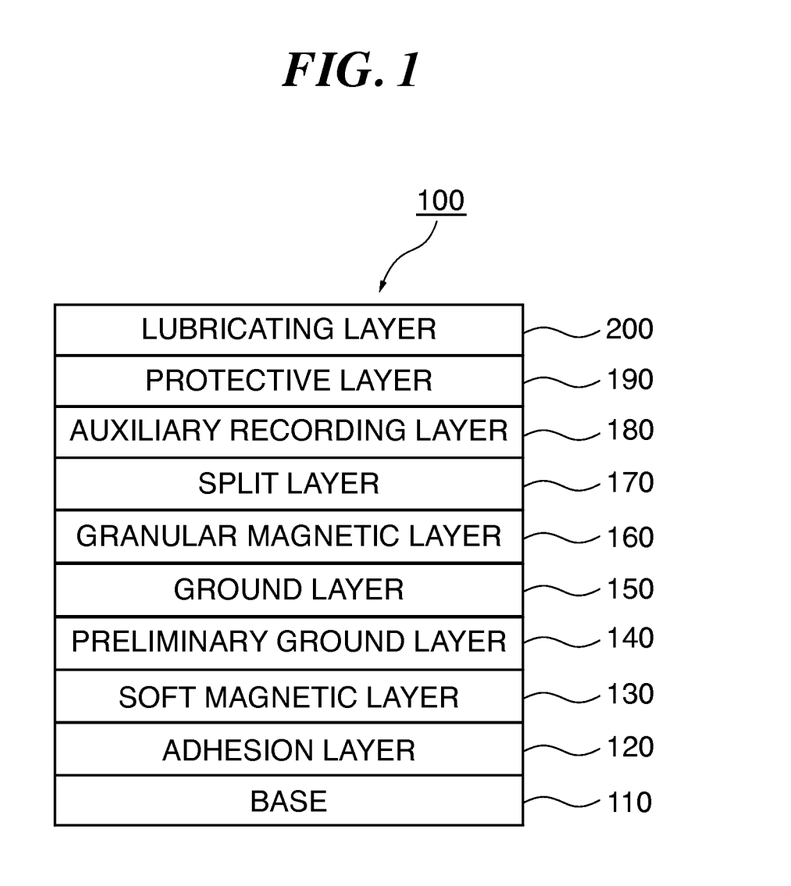
FIG. 1 is a diagram for describing the structure of a perpendicular magnetic disk.

FIG. 1 is a diagram for describing the structure of a perpendicular magnetic disk 100 according to a first embodiment. The perpendicular magnetic disk 100 shown in FIG. 1 includes a base 110, an adhesion layer 120, a soft magnetic layer 130, a preliminary ground layer 140, a ground layer 150, a granular magnetic layer 160, a split layer 170, an auxiliary recording layer 180, a protective layer 190, and a lubricating layer 200.

As the base 110, a glass disk formed by molding an amorphous aluminosilicate glass in a disk form by direct pressing can be used. Note that the type, size, thickness, and others of the glass disk are not particularly restrictive. As a material of the glass disk, for example, an aluminosilicate glass, a soda lime glass, a soda aluminosilicate glass, an aluminoborosilicate glass, a borosilicate glass, a quartz glass, a chain silicate glass, or a glass ceramic, such as a crystallized glass, is used. On this glass disk, grinding, polishing, and chemical strengthening are sequentially performed, and a smooth non-magnetic base 110 formed of the chemically-strengthened glass disk can be obtained.

On the base 110, the adhesion layer 120 to the auxiliary recording layer 180 are sequentially formed by DC magnetron sputtering, and the protective layer 190 can be formed by CVD. Thereafter, the lubricating layer 200 can be formed by dip coating. The structure of each layer is described below.

The adhesion layer 120 is formed in contact with the base 110, including a function of increasing a close contact strength between the soft magnetic layer 130 formed on the adhesion layer 120 and the base 110. It is preferred that the adhesion layer 120 is an amorphous alloy film made from, for example, a CrTi-type amorphous alloy, a CoW-type amorphous alloy, a CrW-type amorphous alloy, a CrTa-type amorphous alloy, or a CrNb-type amorphous alloy. The film thickness of the adhesion layer 120 may be set in a range of, for example, about 2 to 20 nm. The adhesion layer 120 may be a monolayer or may be formed by laminating a plurality of layers.

The soft magnetic layer 130 serves to converge writing magnetic field from a head to assist writing ease of a signal into the granular magnetic layer 160 and achievement of a high density when the signal is recorded in the perpendicular magnetic recording type. AS a soft magnetic material, a material exhibiting a soft magnetic characteristic, such as not only a cobalt-type alloy such as CoTaZr but also an FeCo-type alloy such as FeCoCrB, FeCoTaZr, or FeCoNiTaZr, or an NiFe-type alloy can be used. The soft magnetic layer 130 may be configured to have AFC (Antiferro-magnetic exchange coupling) by interposing a spacer layer composed of Ru in an approximately intermediate portion of the soft magnetic layer 130. Since perpendicular components of magnetization can be made considerably small by adopting such a configuration, noise occurring from the soft magnetic layer 130 can be reduced. In the configuration including the interposition of the spacer layer, the film thickness of the soft magnetic layer 130 may be set such that the spacer layer is in a range of about 0.3 to 0.9 nm and layers made of soft magnetic material and positioned above and below the spacer layer are in a range of about 10 to 50 nm, respectively.

The preliminary ground layer 140 includes a function of promoting a crystalline orientation of the ground layer 150 formed above the preliminary ground layer 140 and a function of controlling a fine structure such as a particle diameter or the like. The preliminary ground layer 140 may have the hcp structure, but it preferably has a face-centered cubic structure (fcc structure) where a (111) plane is oriented to be parallel with a main surface of the base 110. As a material of the preliminary ground layer 140, for example, Ni, Cu, Pt, Pd, Ru, Co, or Hf, or an alloy that contains a metal thereof as a main component and is added with at least one of V, Cr, Mo, W, Ta, and the like may be used. Specifically, NiV, NiCr, NiTa, NiW, NiVCr, CuW, CuCr, or the like can be selected preferably. The film thickness of the preliminary ground layer 140 may be set in a range of about 1 to 20 nm. Further, the preliminary ground layer 140 may have a multi-layered structure.

The ground layer 150 has the hcp structure, including a function of promoting a crystalline orientation of magnetic crystal particles (hereinafter, referred to as "magnetic particles") in the hcp structure of the granular magnetic layer 160 formed above the ground layer 150 and a function of controlling a fine structure such as a particle diameter or the like, and is a layer serving as the so-called base for the granular structure. Because Ru takes the same hcp structure as Co and has crystal lattice spacing close to that of Co, magnetic particles containing Co as a main component can be well oriented. Therefore, the crystalline orientation of the granular magnetic layer 160 can be more improved as the crystalline orientation of the ground layer 150 becomes higher. Further, by making the particle diameters in the ground layer 150 fine, the particle diameters of the magnetic particles in the granular magnetic layer 160 can be made fine. As a material of the ground layer 150, Ru is typical, but a metal of Cr, Co, or the like, or an oxide may be added into Ru. The film thickness of the ground layer 150 can be set in a range of, for example, about 5 to 40 nm.

The ground layer 150 may be formed to have a two-layered structure by changing gas pressure during sputtering. Specifically, if Ar gas pressure applied when a layer positioned on a top side of the ground layer 150 is formed is higher than that applied when a layer positioned on a bottom side thereof is formed, the particle diameters of the magnetic particles can be made fine while the crystalline orientation of the upper side granular magnetic layer 160 is maintained well.

The granular magnetic layer 160 has a column-shaped granular structure in which a non-magnetic substance containing an oxide as a main component is caused to segregate about magnetic particles of a ferromagnetic substance containing a Co—Pt-type alloy as a main component to form a grain boundary. For example, by forming a film using a target obtained by mixing $SiO_2$, $TiO_2$ or the like into a CoCrPt-type alloy, $SiO_2$ or $TiO_2$ that is the non-magnetic substance segregates around magnetic particles (grains) composed of the CoCrPt-type alloy to form a gain boundary, so that the magnetic particles can form a granular structure where magnetic particles have grown in a column shape (a granular magnetic layer forming step).

Note that the substance used in the granular magnetic layer 160 described above is only one example, but this is not meant to be restrictive. As the CoCrPt-type alloy, an alloy obtained by adding at least one kind of B, Ta, Cu, or the like into CoCrPt may be used. The non-magnetic substance forming the grain boundary may be, for example, an oxide such as silicon oxide ($SiO_2$), titanium oxide ($TiO_2$), chromium oxide ($Cr_2O_3$), zirconium oxide ($ZrO_2$), tantalum oxide ($Ta_2O_5$), or cobalt oxide (Co or $Co_3O_4$). Furthermore, it is possible to use not only one kind of oxide but also a composite oxide composed of two or more kinds of oxides.

The split layer 170 is provided between the granular magnetic layer 160 and the auxiliary recording layer 180, and serves to adjust strength of exchange coupling therebetween. Therefore, since strength of magnetic interaction acting between the granular magnetic layer 160 and the auxiliary recording layer 180 and between adjacent magnetic particles in the granular magnetic layer 160 can be adjusted, a recording and reproducing characteristic such as an overwrite characteristic or an SNR characteristic can be improved while a magnetostatic value relating to a resistance to heat fluctuation such as a coercive force Hc or a reversed magnetic domain nucleation magnetic field Hn is maintained.

It is preferred that the split layer 170 is a layer containing Ru or Co having an hcp crystalline structure as a main component so as not to cause inheritance of a crystalline orientation to lower. As the Ru-type material, a material obtained by adding another metal element, oxygen or an oxide into Ru can be used besides Ru. Further, as the Co-type material, a CoCr alloy or the like can be used. As a specific example, Ru, RuCr, RuCo, Ru—$SiO_2$, Ru—$WO_3$, Ru—$TiO_2$, CoCr, CoCr—$SiO_2$, CoCr—$TiO_2$, or the like can be used. Incidentally, a non-magnetic substance is ordinarily used in the split layer 170, but a substance having weak magnetism may be used. Further, it is preferred that the film thickness of the split layer 170 is in a range of 0.2 to 1.0 nm in order to obtain a well exchange coupling strength.

As an action of the split layer 170 to a structure, there is a promotion of separation of crystal particles in the auxiliary recording layer 180 which is an upper layer of the split layer 170. For example, even if the upper layer is a material that does not contain a non-magnetic substance like an oxide, a gain boundary of magnetic crystal particles can be clarified.

Incidentally, the structure where the split layer 170 is provided between the granular magnetic layer 160 and the auxiliary recording layer 180 is adopted in this embodiment, but this is not meant to be restrictive. Accordingly, a structure where the auxiliary recording layer 180 is formed immediately on the granular magnetic layer 160 without providing the split layer 170 can be adopted.

The auxiliary recording layer 180 is a magnetic layer that is approximately magnetically continuing in an in-plane direction of a main surface of the base. Since the auxiliary recording layer 180 has a magnetic interaction (exchange coupling) to the granular magnetic layer 160, it is possible to adjust a magnetostatic characteristic such as a coercive force Hc or a reversed magnetic domain nucleation magnetic field Hn, so that the auxiliary recording layer 180 is provided for improvement in resistance to heat fluctuation, OW characteristic, and SNR.

Incidentally, "magnetically continuing" means that magnetism continues without interruption. "Approximately continuing" means that the auxiliary recording layer 180 is not necessarily a single magnet when observed as a whole and the magnetism may be discontinued partially. That is, the auxiliary recording layer 180 requires only that magnetism continues across (so as to flop over) an agglomerate of a plurality of magnetic particles. In the auxiliary recording layer 180, a structure in which, for example, Cr has segregated may be adopted as long as this condition is satisfied.

In this embodiment, a film containing a CoCrPtRu alloy as a main component and having a thickness of 1.5 to 4 nm is formed as the auxiliary recording layer 180 (auxiliary recording layer forming step). By causing the auxiliary recording layer 180 to contain Ru in this manner, crystallinity of the auxiliary recording layer 180 can be improved. By improving the crystallinity of the auxiliary recording layer 180, disturbance of crystals in an initial growth stage of the auxiliary recording layer 180 can be reduced even on the grain boundary (oxide) of the granular magnetic layer 160. Accordingly, even if Ms is enhanced, increasing noise can be suppressed and the film thickness can be made thin.

As described above, by forming the auxiliary recording layer 180 as a thin film having a film thickness of about 1.5 nm to 4.0 nm, reduction of noise occurring from the auxiliary recording layer 180 can be achieved and overwrite characteristic can be improved by reducing a magnetic spacing between a magnetic head and the soft magnetic layer. Incidentally, if the film thickness of the auxiliary recording layer 180 is set to be less than 1.5 nm, SNR becomes insufficient or the inherent function of the auxiliary recording layer that assists writing cannot be exhibited. It is thought that this is because effect of disturbance of crystallinity in the initial growth stage becomes large even if the auxiliary recording layer 180 is made of the above materials. If the film thickness is thicker than 4.0 nm, heat during the heating step described later is not well transferred to the auxiliary recording layer 180, so that the effect of SNR improvement cannot be obtained and the effect of reduction of the magnetic spacing cannot be obtained.

It is preferred that the Cr content in the CoCrPtRu alloy which is the main component in the auxiliary recording layer 180 is in a range of 4 at % to 8 at %. When the Cr content exceeds 8 at %, there is a possibility that the saturation magnetization Ms of the auxiliary recording layer 180 lowers excessively, so that the inherent function of the auxiliary recording layer is not exhibited. On the contrary, when the Cr content is less than 4 at %, there is a possibility that the saturation magnetization Ms becomes excessively high, so that the auxiliary recording layer 180 constitutes a noise source.

It is preferred that the Ru content in the CoCrPtRu alloy which is the main component in the auxiliary recording layer 180 is in a range of 3 at % to 10 at %. This is because, when the Ru content is less than 3 at %, the effect of crystallinity improvement cannot be obtained sufficiently, while the amount of Co in the auxiliary recording layer 180 becomes insufficient and the saturation magnetization Ms becomes excessively low when the Ru content exceeds 10 at %.

Note that an additive such as B, Ta or Cu may be further added into the CoCrPtRu alloy which is the main component. Specifically, the auxiliary recording layer 180 may be composed of CoCrPtRu, CoCrPtRuB, CoCrPtRuTa, CoCrPtRuCu, CoCrPtRuCuB, or the like.

Further, as a feature factor of this embodiment, the base formed with the auxiliary recording layer 180 is heated up to a temperature range of 210 to 250° C. (heating step) after the auxiliary recording layer forming step. As described above, since the auxiliary recording layer 180 according to this embodiment is a thin film having a film thickness of about 1.5 nm to 4.0 nm, effective transfer of heat during the heating step is performed. Thereby, since discharge of Cr into the grain boundary is properly performed, SNR can be suitably improved.

Incidentally, when the heating temperature is less than 210° C., heat is insufficient so that the effect of the SNR improvement cannot be obtained sufficiently, which is not desirable. On the other hand, when the heating temperature exceeds 250° C., diffusion of elements is caused by excessive heat, so that the structures of the granular magnetic layer 160 and the auxiliary recording layer 180 may be disturbed, which is unsuitable.

The protective layer 190 is a layer for protecting the perpendicular magnetic disk 100 from an impact of the magnetic head. The protective layer 190 can be formed by forming a film containing carbon by CVD. In general, a carbon film formed by CVD has a film hardness improved as compared with that formed by sputtering, and therefore the perpendicular magnetic disk 100 can be effectively protected from an impact from the magnetic head, which is preferable. The film thickness of the protective film 190 may be set in a range of, for example, 2 to 6 nm.

The lubricating layer 200 is formed in order to prevent the protective layer 190 from being damaged when the magnetic head comes in contact with a surface of the perpendicular magnetic disk 100. For example, the lubricating layer 200 can be formed by application of PFPE (Perfluoropolyether) utilizing dip coating. The film thickness of the lubricating layer 200 may be set in a range of, for example, 0.5 to 2.0 nm.

EXAMPLES

In order to confirm effectiveness of the perpendicular magnetic disk 100 having the above configuration, explanation will be made using the following examples and comparative examples.

As examples, the adhesive layer 120 to the auxiliary recording layer 180 were sequentially formed on the base 110 in an Ar atmosphere by DC magnetron sputtering using an apparatus for film formation subjected to vacuuming. Note that an Ar gas pressure at a film formation time is 0.6 Pa unless otherwise specified. As the adhesion layer 120, a 10-nm-thick Cr-50Ti film was formed. As the soft magnetic layer 130, 20-nm-thick 92(40Fe-60Co)-3Ta-5Zr films were respectively formed so as to sandwich a 0.7-nm-thick Ru layer therebetween. As the preliminary ground layer 140, an 8-nm-thick Ni-5W film was formed. As the ground layer 150, a 10-nm-thick Ru film was formed at 0.6 Pa and a 10-nm-thick Ru film was further formed thereon at 5 Pa. As the granular magnetic layer 160, a 2-nm-thick 90(70Co-10Cr-20Pt)-10 (Cr$_2$O$_3$) film was formed at 3 Pa and a 12-nm-thick 90(72Co-10Cr-19Pt)-5(SiO$_2$)-5(TiO$_2$) film was further formed thereon at 3 Pa. As the split layer 170, a 0.3-nm-thick Ru film was formed. As the auxiliary recording layer 180, examples and comparative examples were produced and compared with each other, as described below. As the protective layer 190, a 4.0-nm-thick film was formed by CVD using C$_2$H$_4$, and a surface layer thereof was subjected to nitriding treatment. After the auxiliary recording layer 180 was formed, the heating step was carried out while the temperature was changed in the following manner and comparison was made. As the lubricating layer 200, a 1.0-nm-thick film was formed by dip coating using PFPE.

Figure 2:
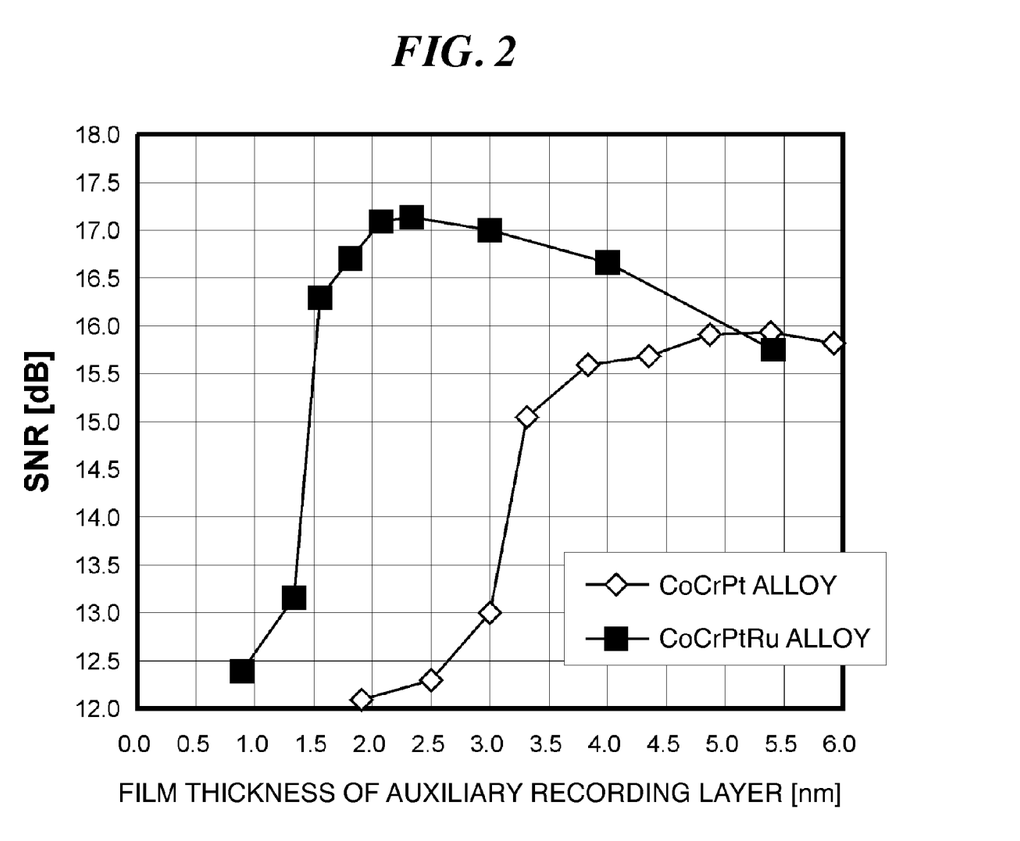
FIG. 2 is a graph for comparing a case in which Ru is added in an auxiliary recording layer and a case in which Ru is not added therein with each other.

FIG. 2 is a graph comparing a case in which Ru was added into the auxiliary recording layer 180 and a case in which Ru was not added with each other. As an example of addition of Ru, a film of a CoCrPtRu alloy (68Co-6Cr-15Pt-6Ru-5B) was formed while a film thickness thereof was changed. As an example of non-addition of Ru, a film of a CoCrPt alloy (62Co-18Cr-15Pt-5B) was formed while a film thickness thereof was changed. Note that the temperature of the heating step at this time was 230° C.

Referring to FIG. 2, it is found that the auxiliary recording layer 180 composed of the CoCrPtRu alloy has a high SNR from a range in which a film thickness thereof is thin, as compared with the auxiliary recording layer 180 composed of the CoCrPt alloy. A curve showing fluctuation of the SNR transits to a thin film thickness of about 1.5 nm and the SNR is further improved, when observed as a whole. It is understood from this that thinning of the auxiliary recording layer 180 can be achieved. Further specifically, it is found that an extremely high SNR can be obtained in a film thickness range of 1.5 nm to 4.0 nm in the auxiliary recording layer 180 composed of the CoCrPtRu alloy. On the other hand, in the auxiliary recording layer 180 composed of the CoCrPt alloy (in which Ru is not contained), the most excellent SNR can be obtained in such a thick range that the film thickness is about 5 nm, but SNR nearly equal to that of the auxiliary recording layer 180 composed of the CoCrPtRu alloy cannot be obtained. From this, it is found that it is difficult to achieve significant improvement in SNR by performing only heating simply, and by performing heating using the CoCrPtRu alloy and setting the film thickness in a range of 1.5 nm to 4.0 nm, thinning can be achieved while performance required as the auxiliary recording layer 180 is maintained, and reduction of noise occurring from the auxiliary recording layer 180 can be achieved.

Further, as described above, in the auxiliary recording layer 180 composed of the CoCrPtRu alloy, since a high SNR can be obtained even if the film thickness is thin, the auxiliary recording layer 180 can be made further thin, and the overwrite characteristic can be improved by reduction of a magnetic spacing between the magnetic head and the soft magnetic layer as an additional effect. Incidentally, it is found that, when a 5-nm-thick film is formed of the CoCrPtRu alloy, the SNR rather lowers. It is thought that this is because a product of the saturation magnetization and the film thickness of the auxiliary recording layer 180 becomes excessively large, so that the auxiliary recording layer 180 constitutes a noise source.

Figure 3:
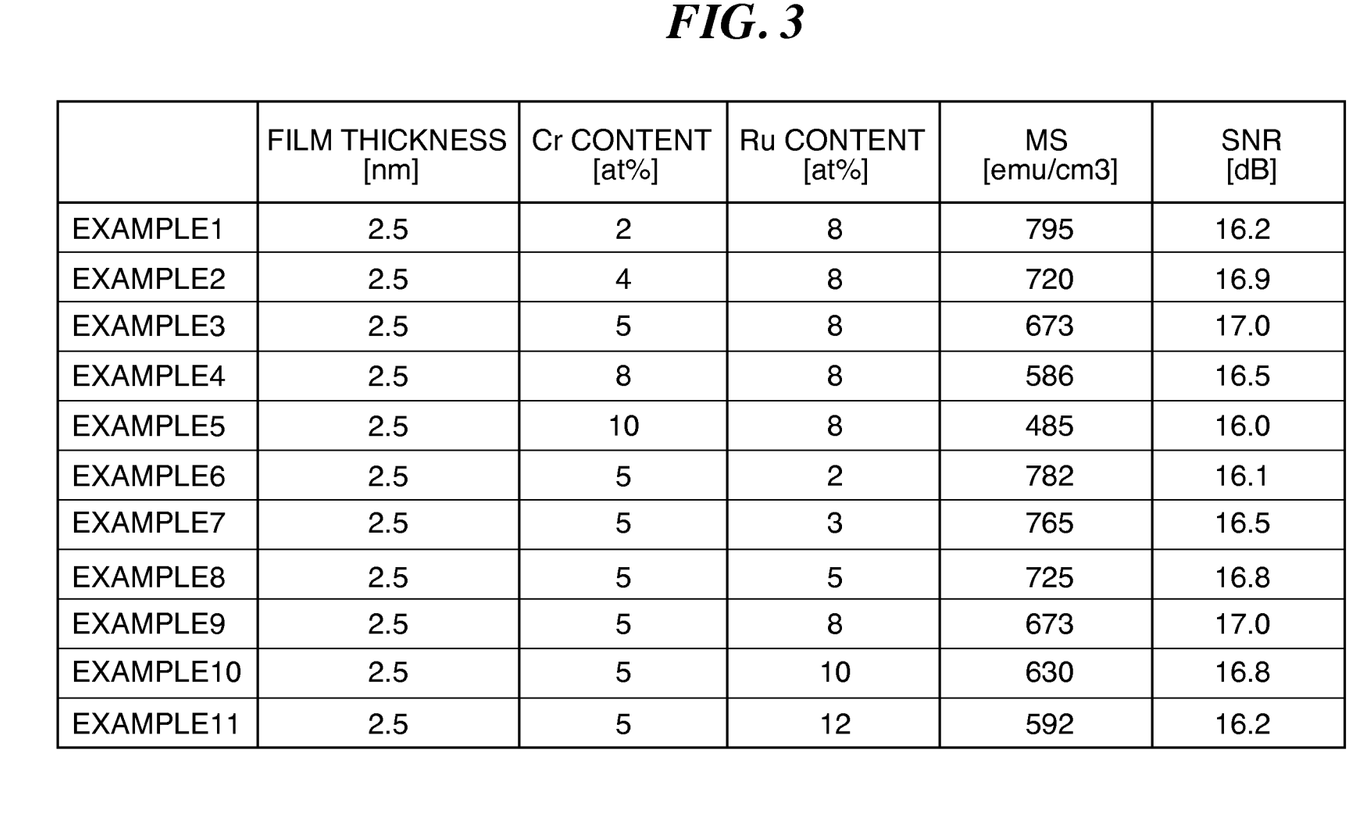
FIG. 3 is a table for describing contents of Cr and Ru in an auxiliary recording layer composed of a CoCrPtRu alloy.

FIG. 3 is a table for describing Cr content and Ru content in the auxiliary recording layer composed of the CoCrPtRu alloy. Note that the temperature at the heating step at this time is 230° C. like the above. Focusing on the Cr content, an example 1 is 2 at %, an example 2 is 4 at %, an example 3 is 5 at %, an example 4 is 8 at %, and an example 5 is 10 at %. In comparison of these examples, it is found that more excellent SNRs are obtained in the examples 2 to 4 than those in the examples 1 and 5. Further, the saturation magnetization Ms is considerably high in the example 1, while the saturation magnetization Ms is extremely low in the example 5. Therefore, there is a possibility that the saturation magnetization Ms is excessively high in the example 1 so that the auxiliary recording layer constitutes a noise source, while there is a fear that the saturation magnetization Ms is excessively low in the example 5 so that the inherent function of the auxiliary recording layer cannot be exhibited. From these matters, it is found that it is preferred that the Cr content is in a range of 4 at % to 8 at %.

Next, focusing on the Ru content, an example 6 is 2 at %, an example 7 is 3 at %, an example 8 is 5 at %, an example 9 is 8 at %, an example 10 is 10 at %, and an example 11 is 12 at %. In comparison of these examples, it is found that, when the Ru content is in a range of 3 to 10 at % like the examples 7 to 10, higher SNRs can be obtained than those in the examples 6 and 11. Further, the saturation magnetization Ms is considerably high in the example 6, while the saturation magnetization Ms is extremely low in the example 11, which may cause a drawback as described above. From these matters, it is found that it is preferred that the Ru content is in a range of 3 at % to 10 at %. Accordingly, the addition amounts of both Cr and Ru effect the saturation magnetization Ms, but by setting the addition amounts in the abovementioned ranges, a balance of a high Ms and a high crystallinity can be achieved, so that a high SNR can be obtained.

Figure 4A:
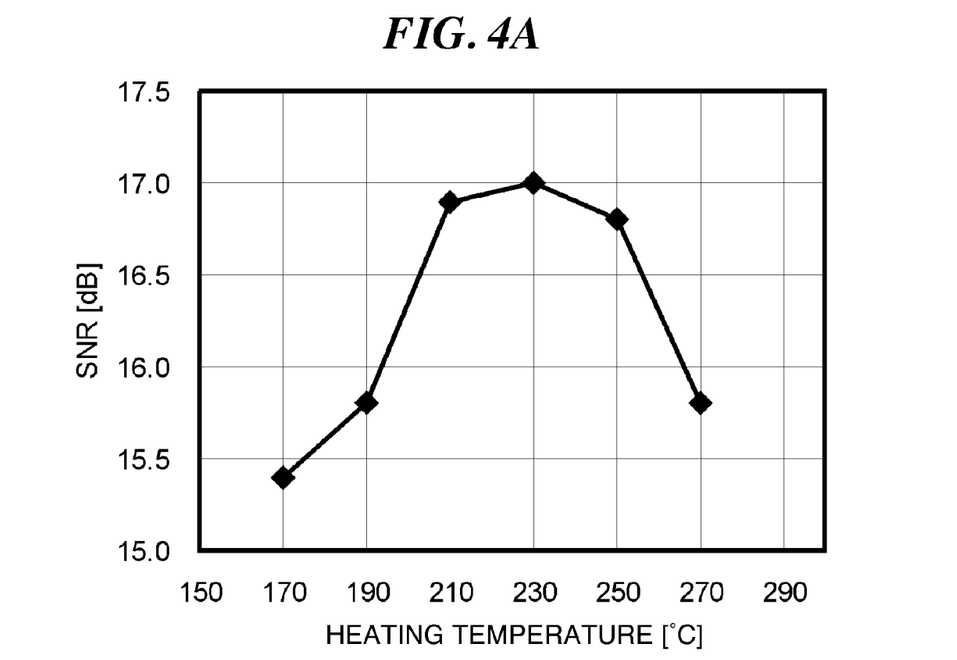
FIGS. 4A and 4B are graphs for describing changes of SNR due to a heating temperature and a film thickness.
Figure 4B:
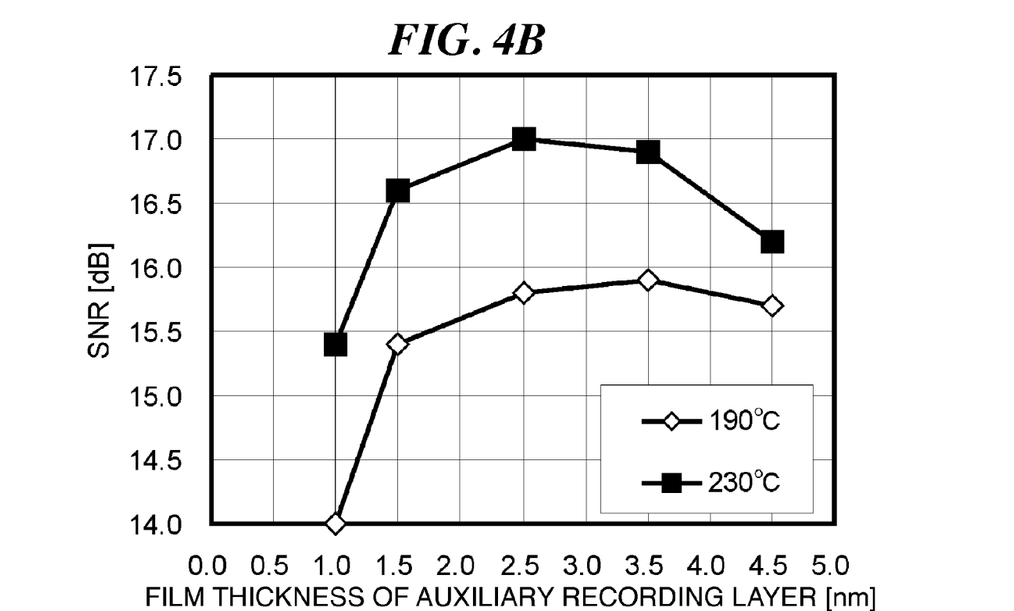

FIGS. 4A and 4B are graphs for describing change of the SNR due to the heating temperature and the film thickness, and FIG. 4A is a graph showing change of the SNR due to the heating temperature, while FIG. 4B is a graph showing change of the SNR due to the film thickness. Note that a CoCrPtRu alloy (67Co-5Cr-15Pt-8Ru-5B) was used as the auxiliary recording layer 180. Furthermore, for easy comparison in FIGS. 4A and 4B, the film thicknesses of the granular magnetic layers 160 were adjusted such that the coercive forces Hc became approximately equal.

As shown in FIG. 4A, the SNR rapidly improves according to rising of the heating temperature approximately beyond 200° C. When the heating temperature is further raised to exceed 250° C., the SNR starts lowering. That is, the best SNR can be obtained in the heating temperature range of 210° C. to 250° C. From these matters, it can be understood that a high SNR can be obtained by heating the base in the temperature range of 210 to 250° C. at the heating step.

Referring to FIG. 4B, it is found that, when heating is carried out at a temperature of 230° C. which falls within the temperature range at the heating step in the abovementioned embodiment, a higher SNR can be obtained than when the heating is performed at a temperature (190° C.) out of the temperature range, and a peak is present at the film thickness of about 2.5 nm. On the other hand, when the heating is performed at a low temperature (190° C.) like a comparative example, such a tendency appears that the SNR increases to a certain degree according to increase of the film thickness, but the increase of the SNR does not reach that obtained when the heating is performed at the temperature of 230° C. From these, it could be confirmed that a high SNR could be obtained by a synergetic effect of using a thin film with a film thickness of 1.5 to 4.0 nm as the auxiliary recording layer 180 and the heating step at a high temperature (210° C. to 250° C.).

Hereinabove, the preferred embodiments of the present invention have been described with reference to the drawings. Needless to say, however, the present invention is not restricted by these embodiments. It is clear that the person skilled in the art can conceive various modifications or variations within the scope of claims for patent, and it should be understood that these modifications belong to the technical scope of the present invention.

INDUSTRIAL APPLICABILITY

The present invention can be utilized as a method for manufacturing a perpendicular magnetic disk to be mounted on an HDD or the like of a perpendicular magnetic recording type.

DESCRIPTION OF REFERENCE NUMERALS

100 . . . perpendicular magnetic disk
110 . . . base
120 . . . adhesion layer
130 . . . soft magnetic layer
140 . . . preliminary ground layer
150 . . . ground layer
160 . . . granular magnetic layer
170 . . . split layer
180 . . . auxiliary recording layer
190 . . . protective layer
200 . . . lubricating layer

The invention claimed is:

1. A method for manufacturing a perpendicular magnetic disk comprises:
    a granular magnetic layer forming step of forming, on a base, a granular magnetic layer in which a grain boundary portion is formed by segregation of a non-magnetic substance containing an oxide as a main component around magnetic particles containing a CoCrPt alloy grown in a columnar shape as a main component;
    an auxiliary recording layer forming step of forming an auxiliary recording layer that contains a CoCrPtRu alloy as a main component and has a film thickness of 1.5 to 4 nm above the granular magnetic layer; and
    a heating step of heating the base formed with the auxiliary recording layer in a temperature range of 210 to 250° C.

2. The method for manufacturing a perpendicular magnetic disk according to claim 1, wherein
    the content of Cr that is a main component in the auxiliary recording layer is in a range of 4 at % to 8 at %.

3. The method for manufacturing a perpendicular magnetic disk according to claim 1, wherein
    the content of Ru that is a main component in the auxiliary recording layer is in a range of 3 at % to 10 at %.

* * * * *